(12) United States Patent
Kim

(10) Patent No.: US 8,227,843 B2
(45) Date of Patent: Jul. 24, 2012

(54) IMAGE SENSOR AND METHOD FOR MANUFACTURING THEREOF

(75) Inventor: Jong-Man Kim, Yongin-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 188 days.

(21) Appl. No.: 12/575,292

(22) Filed: Oct. 7, 2009

(65) Prior Publication Data

US 2010/0090305 A1   Apr. 15, 2010

(30) Foreign Application Priority Data

Oct. 9, 2008   (KR) .................. 10-2008-0099047

(51) Int. Cl.
*H01L 31/062* (2012.01)
*H01L 31/113* (2006.01)

(52) U.S. Cl. ................. 257/291; 257/292; 257/E27.133

(58) Field of Classification Search ........... 257/291–293
See application file for complete search history.

(56) References Cited

U.S. PATENT DOCUMENTS

| 2009/0065823 | A1* | 3/2009 | Hwang | .......................... 257/292 |
| 2009/0065828 | A1* | 3/2009 | Hwang | .......................... 257/292 |

FOREIGN PATENT DOCUMENTS

| KR | 10-2005-0117674 | 12/2005 |
| KR | 10-0856941 | 8/2008 |

\* cited by examiner

*Primary Examiner* — Thien F Tran
(74) *Attorney, Agent, or Firm* — Sherr & Vaughn, PLLC

(57) ABSTRACT

An image sensor and a method for manufacturing an image sensor. An image sensor may include a readout circuitry which may be formed on and/or over a first substrate. An image sensor may include an interlayer dielectric layer formed on and/or over a first substrate. An image sensor may include a metal line formed on and/or over an interlayer dielectric layer, and may include a top plug. An image sensor may include an image sensing device formed on and/or over a top plug. An image sensor may include a first conductive type ion implantation area formed on and/or over an area of an image sensing device corresponding to a top plug. Methods of manufacturing an image sensor are disclosed.

9 Claims, 2 Drawing Sheets

IMAGE SENSOR AND METHOD FOR MANUFACTURING THEREOF

Figure 1:
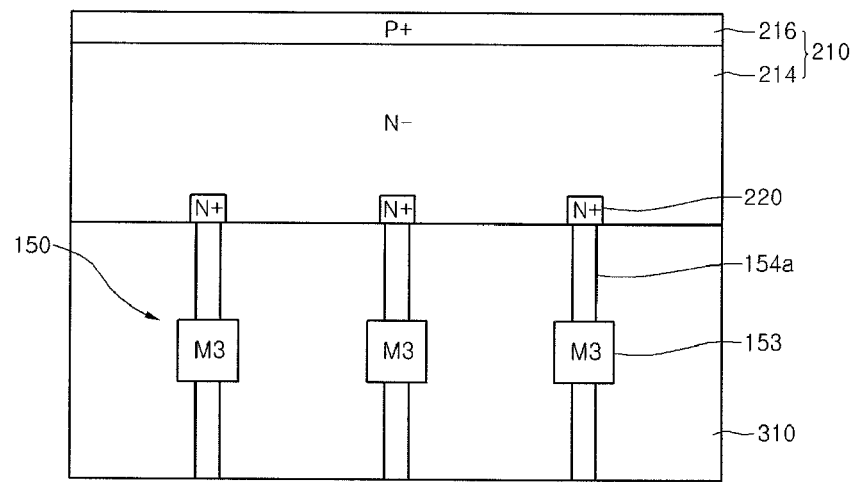

The present application claims priority under 35 U.S.C. 119 to Korean Patent Application No. 10-2008-0099047 (filed on Oct. 9, 2008) which is hereby incorporated by reference in its entirety.

BACKGROUND

Embodiments relate to an electric device and methods thereof. Some embodiments relate to an image sensor, and a method of manufacturing an image sensor.

A photodiode (PD) may be formed by implanting ions into a substrate. As the size of a PD relatively decreases such that the number of pixels relatively increases without a substantial increase of chip size, image quality may be minimized due to an area reduction of a light receiving part. Also, a stack height may not be relatively decreased with respect to a area reduction of a light receiving part, and the number of photons input into a light receiving part may be relatively decreased due to a diffraction of light which may reference "Airy Disk".

A PD may also be deposited by using amorphous silicon (Si). After a readout circuitry is formed on and/or over a Si-substrate through a wafer-to-wafer bonding scheme, a PD may be formed on and/or over a readout circuitry, which may relate to a three-dimensional image sensor. In this case, a PD is connected with readout circuitry through a metal line.

A P+/N−/N+ layer may be formed on and/or over a silicon layer used for a PD, for example as a light receiving part, through an ion implantation process. Ion implantation may be performed with respect to a P+ layer such that a P+ layer may serve as a ground, and a N-layer may serve as a PD area, for example, as a light receiving part. An N+ layer may be used as an ohmic contact area. An ohmic contact may be used to significantly reduce a width of a boundary barrier by relatively increasing N-type doping concentration such that electrons may be subject to tunneling. As a result, an ohmic contact may allow current to smoothly flow in a bi-direction between metal and silicon.

If an N+ area is formed on and/or over an entire surface of a silicon area through an ion implantation process, ion implantation into a remaining area excluding an ohmic contact area may cause a junction leakage current. Accordingly, undesirable electrons may occur in addition to electrons generated by light. This may relatively reduce a module yield rate and/or cause low light performance, for example in a CMOS image sensor (CIS). In addition, charge sharing may occur since both source and drain of a transfer transistor, which may be both terminals of a transfer transistor, may be heavily doped with N type ions. Charge sharing may lower the sensitivity of an output image and/or cause an image error. Photo charges may not smoothly move between a PD and read-out circuitry, such that a dark current may occur, and/or such that saturation and/or sensitivity may be lowered.

Accordingly, there is a need for a image sensor and a method of manufacturing an image sensor which may minimize a junction leakage current, minimize undesirable electrons, minimize degradation of low light performance, maximize a module yield rate, achieve substantially fully-dumping of photo charges, and/or provide a relatively smooth moving path of photo charges.

SUMMARY

Embodiments relate to an image sensor. According to embodiments, an image sensor may include a readout circuitry formed on and/or over a first substrate. In embodiments, an image sensor may include an interlayer dielectric layer formed on and/or over a first substrate. In embodiments, an image sensor may include a metal line formed on and/or over an interlayer dielectric layer, and may include a top plug.

According to embodiments, an image sensor may include an image sensing device formed on and/or over a top plug. In embodiments, a first conductive type ion implantation area may be formed on and/or over an area of an image sensing device, which may correspond to a top plug in accordance with embodiments. Embodiments relate to a method of manufacturing an image sensor.

DRAWINGS

Example FIG. 1 is a sectional view illustrating an image sensor in accordance with embodiments.

Figure 2:
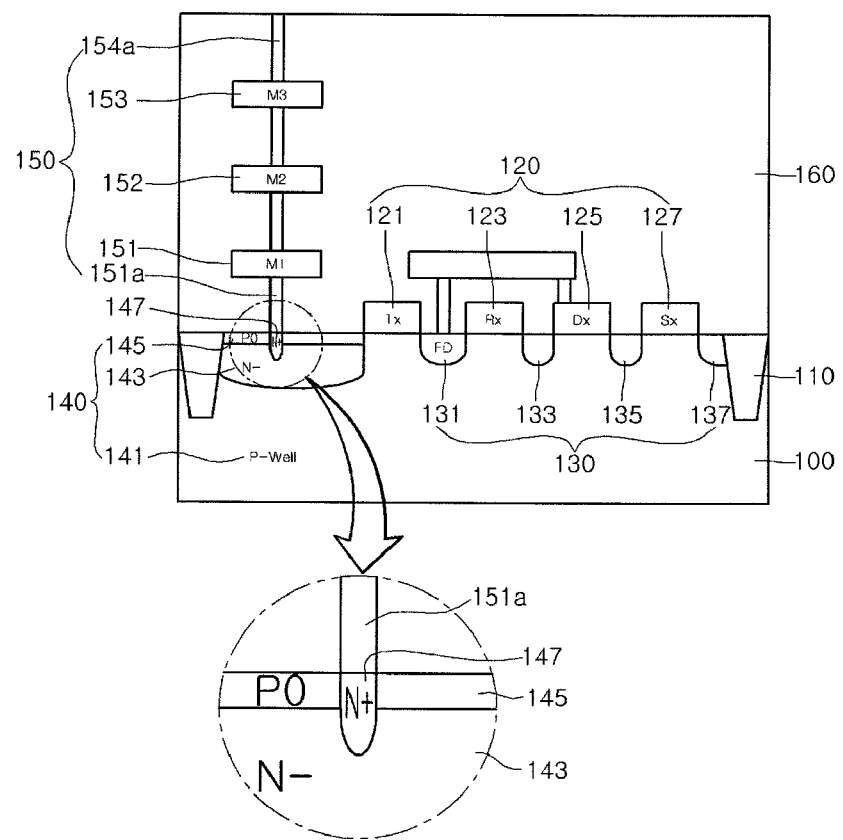
Figure 3:
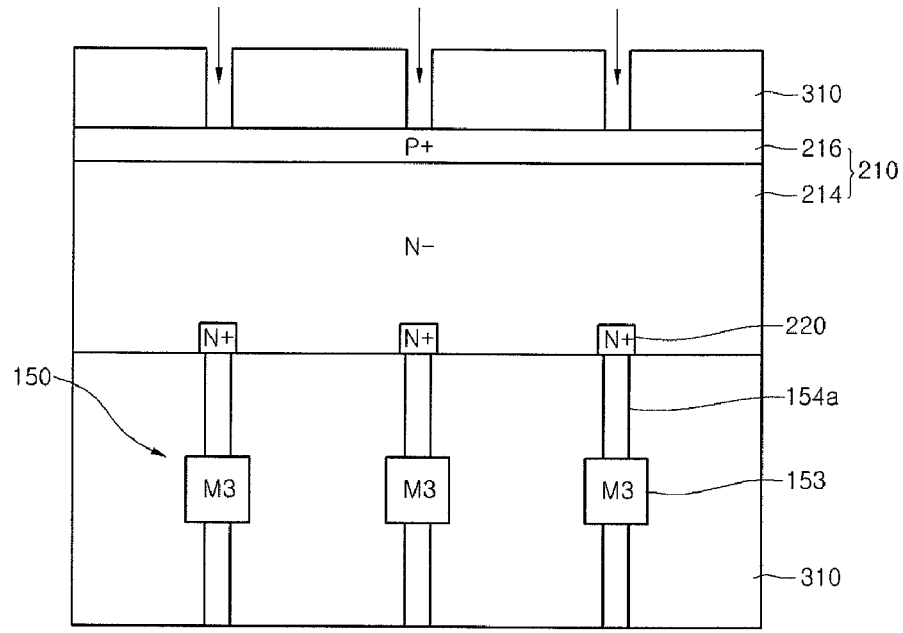

Example FIG. 2 to FIG. 3 are sectional views illustrating a method of manufacturing an image sensor according in accordance with embodiments.

Figure 4:
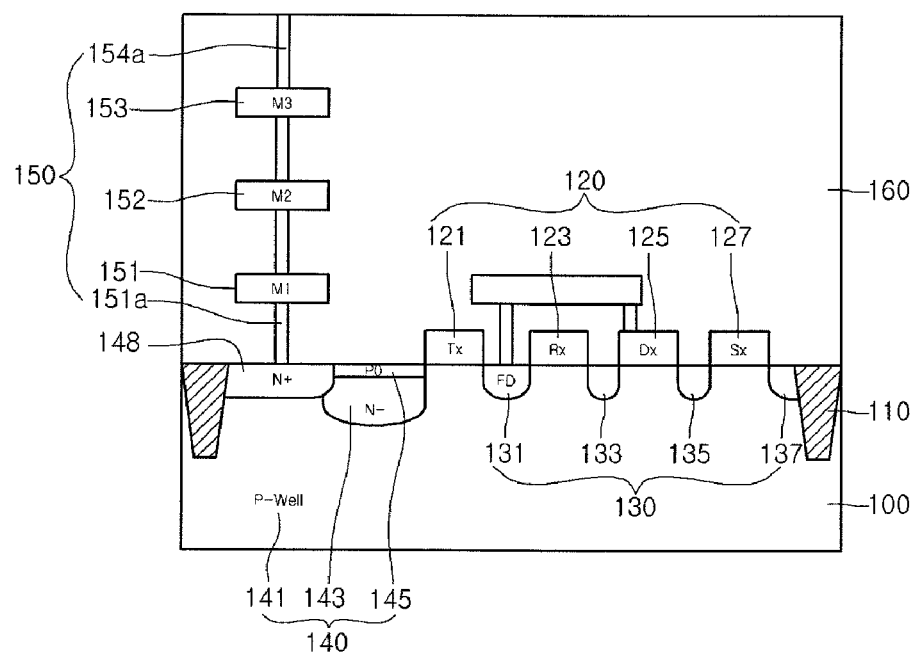

Example FIG. 4 is a sectional view illustrating an image sensor in accordance with embodiments.

DESCRIPTION

Embodiments relate to an image sensor. Embodiments are not limited to a CMOS image sensor, but may be applicable to an image sensor requiring an image sensing device. Referring to example FIG. 1, a sectional view illustrates an image sensor in accordance with embodiments. According to embodiments, an image sensor may include readout circuitry 120. In embodiments, readout circuitry 120 may be formed on and/or over first substrate 100. In embodiments, an image sensor may include inter-layer dielectric layer 160. In embodiments, inter-layer dielectric layer 160 may be formed on and/or over first substrate 100.

According to embodiments, an image sensor may include metal line 150. In embodiments, metal line 150 may be formed on and/or over inter-layer dielectric layer 160. In embodiments, metal line 150 may include top plug 154a. In embodiments, an image sensor may include image sensing device 210. In embodiments, image sensing device 210 may be formed on and/or over top plug 154a. In embodiments, an image sensing device may include ohmic contact area 220. In embodiments, ohmic contact area 220 may be formed on and/or over an area of image sensing device 210 corresponding to top plug 154a.

According to embodiments, an ion implantation process may be performed to form an ohmic contact which may correspond to a top plug area, which may reference a ohmic contact area. In embodiments, junction leakage current may be minimized. In embodiments, undesirable electrons may be substantially removed. In embodiments, degradation of low light performance resulting from undesirable electrons may be minimized.

According to embodiments, image sensing device 210 may include a photodiode, but embodiments are not limited thereto. In embodiments, image sensing device 210 may include a photogate and/or a combination of a photodiode and a photogate. In embodiments, a photodiode may be formed on and/or over a crystalline semiconductor layer, but embodiments are not limited thereto. In embodiments, a photodiode may be formed on and/or over an amorphous semiconductor layer.

Embodiments relate to a method of manufacturing an image sensor in accordance with embodiments. Referring to example FIG. 2, first substrate 100 may be formed including metal line 150 and/or readout circuitry 120. According to embodiments, isolation layer 110 may be formed on and/or over first substrate 100 using a second conductive type, and may define an active area. In embodiments, readout circuitry 120 may include transistors, and may be formed on and/or over an active area. In embodiments, readout circuitry 120 may include transfer transistor (Tx) 121, reset transistor (Rx) 123, drive transistor (Dx) 125, and/or select transistor (Sx) 127.

According to embodiments, ion implantation area 130 may be formed. In embodiments, ion implantation area 130 may include a floating diffusion (FD) area 131 and/or source/drain areas 133, 135, and/or 137 corresponding to respective transistors. In embodiments, noise removing circuitry may be formed, for example to maximize sensitivity.

According to embodiments, electric junction area 140 may be formed on and/or over first substrate 100 when readout circuitry 120 is formed on and/or over first substrate 100. In embodiments, first conductive connection area 147 may be formed on and/or over electric junction area 140 such that electric junction area 140 may be connected to metal line 150.

According to embodiments, electric junction area 140 may include a PN junction area, but embodiments are not limited thereto. In embodiments, electric junction area 140 may include second conductive type well 141. In embodiments, electric junction area 140 may include first conductive type ion implantation layer 143, which may be formed on and/or over a second conductive type epitaxial layer. In embodiments, electric junction area 140 may include second conductive type ion implantation layer 145, which may be formed on and/or over first conductive type ion implantation layer 143. In embodiments, PN junction area 140 may be a P0 145/N-143/P-141 junction area as illustrated in FIG. 2, but embodiments are not limited thereto. In embodiments, first substrate 100 may be conducted with a second conductive type, but the embodiments are not limited thereto.

According embodiments, a device may be designed to have a potential difference between a source and a drain, for example of both terminals of Tx 121, such that substantially fully-dumping of photo charges may be achieved. In embodiments, photo charges generated from the photodiode may be dumped into FD area 131, such that the sensitivity of an output image may be maximized. In embodiments, electric junction area 140 may be formed on and/or over first substrate 100 including readout circuitry 120. In embodiments, there may be a potential difference between a source and a drain, for example of both terminals of Tx 121, such that substantially fully-dumping of the photo charges may be achieved.

According to embodiments, in contrast to FD node 131 having an N+ junction, a P/N/P junction of electric junction area 140 may deliver a portion of applied voltage and may be pinched off at a predetermined voltage. In embodiments, a voltage for a pinch-off may refer to pinning voltage, which may depend on a doping concentration of P0 layer 145 and/or N- layer 143. In embodiments, electrons generated from photodiode 210 may be moved into PNP junction area 140. In embodiments, electrons may be delivered into FD node 131 when Tx 121 is turned on such that electrons may be converted into voltage. In embodiments, since the maximum voltage of P0/N-/P- junction area 140 may become pinning voltage, and the maximum voltage of FD node 131 may be Vdd-Rx Vth, electrons generated from photodiode 210 positioned above a chip may be substantially fully dumped into FD node 131 substantially without charge sharing due to a potential difference between both terminals of Tx 131.

According embodiments, a P0/N-/P-well junction may be formed on and/or over a Si substrate, for example first substrate 100, instead of a N+/P-well junction. In embodiments, since positive voltage may be applied to N-layer 143 and ground voltage may be applied to P0 145 and/or P-well 141 in a P0/N-/P-well junction at 4-Tr APS reset operation, a P0/N-/P-well double junction structure may be pinched off over a predetermined voltage similar to a BJT structure. In embodiments, the voltage may refer to a pinning voltage. In embodiments, a potential difference may occur between both terminals, for example source and drain of Tx 121, such that photo charges may be substantially fully dumped into FD 131 from an N-well through Tx 121 at an on/off operation of Tx 121. In embodiments, charge sharing may be substantially prevented.

According to embodiments, in contrast to a photodiode is connected with an N+ junction area, degradation of saturation and/or sensitivity may be minimized in accordance with embodiments. In embodiments, first conductive type connection area 147 may be formed between a photodiode and readout circuitry 120. In embodiments, a smooth moving path of photo charges may be formed, such that a dark current source is minimized, and degradation of saturation and/or sensitivity may be minimized.

According to embodiments, an N+ doping area can be formed on and/or over a surface of P0/N-/P- junction area 140 as first conductive type connection area 147 for an ohmic contact. In embodiments, N+ area 147 may contact N- area 143, for example through P0 area 145. In embodiments, to substantially prevent first conductive type connection area 147 from serving as a leakage source, the width of first conductive type connection area 147 may be minimized. In embodiments, a plug implantation process may be performed after etching a first metal contact 151*a*, but embodiments are not limited thereto.

According to embodiments, first conductive-type connection area 147 may be formed using an ion implantation pattern as an ion implantation mask after forming an ion implantation pattern. N+ doping may be locally performed in an area for a contact in accordance with embodiments. In embodiments, an ohmic contact may be relatively smoothly formed and/or may minimize a dark signal. However, dark signal may relatively increase when N+ doping is performed on and/or over substantially the entire source area of Tx 121 due to dangling bonding for a surface of the Si-substrate.

According to embodiments, inter-layer dielectric layer 160 may be formed on and/or over first substrate 100. In embodiments, metal line 150 may be formed on and/or over the resultant structure. In embodiments, metal line 150 may include first metal contact 151*a*. In embodiments, metal line 150 may include first metal 151. In embodiments, metal line 150 may include second metal 152. In embodiments, metal line 150 may include third metal 153. In embodiments, metal line 150 may include fourth metal contact 154*a*. Embodiments are not limited thereto. In embodiments, fourth metal contact 154*a* may serve as top plug 154*a*, but embodiments are not limited thereto.

Referring to example FIG. 3, photodiode 210 may be formed on and/or over a crystalline semiconductor layer of a second substrate. According to embodiments, lightly doped first conductive type conductive layer 214 and/or heavily doped second conductive type conductive layer 216 may be formed by implanting ions on and/or over a crystalline semiconductor layer. In embodiments, first substrate 100 may be bonded to a second substrate such that photodiode 210 corresponds to top plug 154*a*. In embodiments, second substrate may be substantially removed except for photodiode 210.

According to embodiments, ohmic contact area 220 may be formed corresponding to top plug 154*a* of image sensing device 210. In embodiments, first conductive type ions may be implanted on and/or over a contact area including top plug 154*a* of image sensing device 210 using photoresist pattern 310 as an ion implantation mask to form ohmic contact area 220. In embodiments, ion implantation for an ohmic contact may be performed with respect to a top plug area, which may be an ohmic contact area, to minimize junction leakage current. In embodiments, undesirable electrons may be removed such that degradation of low light performance due to undesirable electrons may be minimized. In embodiments, a module yield rate and/or low light performance of a CMOS image sensor may be maximized.

According to embodiments, photoresist pattern 310 may be removed and an etching process may be performed, for example to divide image sensing device 210 according to pixels. In embodiments, an insulating layer may fill an etched part, for example between pixels, such that pixels may be separated from each other. In embodiments, processes for an upper electrode, a color filter, and/or a ground may be performed.

Embodiments relate to an image sensor and a method of manufacturing an image sensor. According to embodiments, ohmic contact area 220 may include a first conductive type ion implantation area 220. In embodiments, ohmic contact area 220 may be formed before first substrate 100 is bonded to a second substrate. In embodiments, ohmic contact area 220 may be formed on and/or over a second substrate using a photoresist pattern as an ion implantation mask before or after image sensing device 210 is formed on and/or over a second substrate.

Embodiments relate to an image sensor and a method of manufacturing an image sensor. Referring to example FIG. 4, a sectional view illustrates an image sensor in accordance with embodiments. According to embodiments, first substrate 100 may be formed including readout circuitry 120, electric junction area 140 and/or metal line 150. In embodiments, an image sensor may include readout circuitry 120, which may be formed on and/or over first substrate 100. In embodiments, an image sensor may include inter-layer dielectric layer 160, which may be formed on and/or over first substrate 100.

According to embodiments, an image sensor may include metal line 150 on and/or over dielectric layer 160, which may include top plug 154a. In embodiments, an image sensor may include image sensing device 210 formed on and/or over top plug 154a. Ohmic contact area 220 may be formed on and/or over an area of image sensing device 210 corresponding to the top plug 154a in accordance with embodiments.

According to embodiments, an embodiment illustrated in FIG. 4 may employ the technical features other embodiments, for example of the embodiment illustrated in FIG. 1. In embodiments, first conductive type connection area 148 may be formed at one side of electric junction area 140. In embodiments, N+ connection area 148 for an ohmic contact may be formed on and/or over P0/N−/P− junction area 140. In embodiments, N+ connection area 148 and/or MIC contact 151a may be formed.

A leakage source may occur since a device may operate in a state in which reverse bias is applied to P0/N−/P− junction area 140, such that an electric field (EF) occurs on and/or over a substrate surface, for example a Si surface. A crystal defect caused in a contact forming process may become a leakage source in the electric field. N+ connection area 148 may be formed on and/or over a surface of the P0/N−/P− junction area 140, such that an electric field may additionally occur due to an N+/P0 junction. This electric field may make a leakage source.

According to embodiments, a structure is disclosed in which first contact plug 151a may be connected with N− junction 143, for example after forming first contact plug 151a on and/or over an active area which may include N+ connection area 148 without doping ions on and/or over a P0 area. Accordingly, in embodiments, an electric field may not be generated on and/or over a Si surface. In embodiments, dark current of a 3-D integrated CIS may be reduced.

According to embodiments, ion implantation for an ohmic contact may be performed with respect to a top plug area which may be an ohmic contact area. In embodiments, a junction leakage current may be minimized. In embodiments, undesirable electrons may be minimized. In embodiments, degradation of low light performance may be minimized due to the undesirable electrons. In embodiments, a module yield rate and/or the low light performance of a CMOS image sensor may be maximized.

According to embodiments, a device may be designed to have a potential difference between a source and a drain, for example of both terminals of a Tx, such that substantially fully-dumping of photo charges may be achieved.

According to embodiments, a charge connection area may be formed between a photodiode and readout circuitry such that a relatively smooth moving path of photo charges may be formed. In embodiments, a dark current source may be minimized. In embodiments, degradation of saturation and/or sensitivity may be minimized.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. An apparatus comprising:
 a readout circuitry formed over a first substrate;
 an interlayer dielectric layer formed over said first substrate;
 a metal line comprising a top plug formed in said interlayer dielectric layer;
 an image sensing device formed over said top plug; and
 an ohmic contact area formed on a top of said top plug so that the image sensing device contacts with the metal line through the ohmic contact area while directly contacting with the interlayer dielectric layer at a place beside the ohmic contact area.

2. The apparatus of claim 1, wherein said ohmic contact area is formed over a contact area between said image sensing device and said top plug.

3. The apparatus of claim 1, comprising an electric junction area formed over said first substrate such that said electric junction area is electrically connected to said readout circuitry.

4. The apparatus of claim 3, wherein said electric junction area comprises:
 a first conductive type ion implantation area formed over said first substrate; and
 a second conductive type ion implantation area formed over said first conductive type ion implantation area.

5. The apparatus of claim 3, wherein said readout circuitry comprises a transistor configured to include a potential difference between a source and a drain of the transistor.

6. The apparatus of claim 3, wherein said electric junction area comprises a PN junction.

7. The apparatus of claim 3, further comprising a first conductive type connection area formed at one side of the electric junction area, and a transfer transistor formed at another side of the electric junction area.

8. The apparatus claim 7, wherein said first conductive type connection area is electrically connected to said metal line at one side of the electric junction area.

9. The apparatus of claim 1, wherein said image sensing device is formed over at least one of:
 a crystalline semiconductor; and
 an amorphous semiconductor.

* * * * *